(12) United States Patent
Lee et al.

(10) Patent No.: US 8,445,882 B2
(45) Date of Patent: May 21, 2013

(54) NON-VOLATILE MEMORY ELEMENT AND MEMORY DEVICE INCLUDING THE SAME

(75) Inventors: Dong-soo Lee, Gunpo-si (KR); Man Chang, Seongnam-si (KR); Young-bae Kim, Seoul (KR); Myoung-jae Lee, Hwaseong-si (KR); Chang-bum Lee, Seoul (KR); Seung-ryul Lee, Seoul (KR); Chang-jung Kim, Yongin-si (KR); Ji-hyun Hur, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 70 days.

(21) Appl. No.: 13/114,497

(22) Filed: May 24, 2011

(65) Prior Publication Data

US 2012/0018695 A1    Jan. 26, 2012

(30) Foreign Application Priority Data

Jul. 23, 2010    (KR) .......................... 10-2010-0071611

(51) Int. Cl.
*H01L 29/02*    (2006.01)

(52) U.S. Cl.
USPC ..... 257/2; 257/3; 257/4; 257/5; 257/E29.002; 438/102; 438/103; 438/104

(58) Field of Classification Search
USPC ................... 257/2–5, E29.002; 438/102–104
See application file for complete search history.

(56) References Cited

U.S. PATENT DOCUMENTS

| 2008/0001172 A1* | 1/2008 | Karg et al. ..................... 257/194 |
| 2009/0039332 A1 | 2/2009 | Lee et al. |
| 2009/0218565 A1 | 9/2009 | Kawano et al. |
| 2010/0065803 A1 | 3/2010 | Choi et al. |
| 2010/0117053 A1 | 5/2010 | Sekar et al. |
| 2010/0207094 A1* | 8/2010 | Kanzawa et al. ................. 257/4 |
| 2011/0044088 A1* | 2/2011 | Muraoka et al. .............. 365/148 |

FOREIGN PATENT DOCUMENTS

| CN | 101621114 | 1/2010 |
| JP | 2010021381 A | 1/2010 |
| KR | 100693409 | 3/2007 |
| WO | WO 2010/004705 | 1/2010 |

OTHER PUBLICATIONS

European Patent Office Search Report dated Apr. 5, 2012 for Application No. 11173246.7.

* cited by examiner

*Primary Examiner* — Jami M Valentine
(74) *Attorney, Agent, or Firm* — Harness, Dickey & Pierce, P.L.C.

(57) ABSTRACT

Example embodiments, relate to a non-volatile memory element and a memory device including the same. The non-volatile memory element may include a memory layer having a multi-layered structure between two electrodes. The memory layer may include first and second material layers and may show a resistance change characteristic due to movement of ionic species therebetween. The first material layer may be an oxygen-supplying layer. The second material layer may be an oxide layer having a multi-trap level.

40 Claims, 6 Drawing Sheets

<SET OPERATION>

<RESET OPERATION>

NON-VOLATILE MEMORY ELEMENT AND MEMORY DEVICE INCLUDING THE SAME

CROSS-REFERENCE TO RELATED APPLICATION

This application claims priority under 35 U.S.C. §119 to Korean Patent Application No. 10-2010-0071611, filed on Jul. 23, 2010 with the Korean Intellectual Property Office, the disclosure of which is incorporated herein in its entirety by reference.

BACKGROUND

1. Field

The present disclosure relates to non-volatile memory elements and memory devices including the same.

2. Description of the Related Art

Examples of non-volatile memory devices include a resistive random access memory (RRAM), a magnetic random access memory (MRAM), a ferroelectric random access memory (FRAM), and a phase-change random access memory (PRAM). A RRAM device stores data based on a resistance change of a material (e.g., transition metal oxide). The resistance of a resistance-change material can be changed from a higher-resistance state to a lower-resistance state when a voltage applied to the resistance-change material is greater than or equal to a set voltage. On the other hand, the resistance of the resistance-change material can be switched back to the higher-resistance state when a voltage applied to the resistance-change material is greater than or equal to a reset voltage. The higher-resistance state of the resistance-change material is commonly considered an OFF state, and the lower-resistance state is considered an ON state.

Generally, a resistive memory device includes a storage node having a resistance-change material layer and a switching device which is electrically connected to the storage node. The switching device controls signal access to the storage node.

SUMMARY

Example embodiments relate to non-volatile memory elements using resistance changes.

Example embodiments also relate to memory devices including the non-volatile memory elements.

Additional aspects will be set forth in part in the description which follows and, in part, will be apparent from the description, or may be learned by practice of the non-limited embodiments presented herein.

A non-volatile memory element according to example embodiments may include a first electrode; a second electrode; and a memory layer disposed between the first and second electrodes, wherein the memory layer may include an oxygen-supplying layer and an oxide layer, the oxide layer may have a multi-trap level (a plurality of trap levels), and the memory layer may have a resistance change characteristic.

The oxygen-supplying layer may include at least one of Ta oxide, Zr oxide, yttria-stabilized zirconia (YSZ), Ti oxide, Hf oxide, Mn oxide, Mg oxide, and a combination thereof.

The oxygen-supplying layer may include $TaO_x$, wherein, $x<2.5$.

The oxide layer may include an oxide having a plurality of oxidation states.

The oxide may include at least one of Zr oxide, Mn oxide, Fe oxide, Mo oxide, W oxide, and Ln oxide.

The oxide may be a Zr oxide.

The oxygen-supplying layer may include Ta oxide.

The oxide layer may be doped with at least one of Y, Sc, Ca, and La.

The oxide layer may have a thickness in the range of about 5 to about 30 nm.

The oxide layer may be a material layer, and an oxygen concentration in the material layer may be changed gradually or regionally in a thickness direction.

The oxygen concentration of the oxide layer may increase toward the second electrode.

The non-volatile memory element may further include a reaction-inhibiting layer disposed between the first electrode and the memory layer.

The reaction-inhibiting layer may include at least one of $AlO_x$, $SiO_x$, $SiN_x$, $ZrO_x$, $HfO_x$, and a combination thereof.

At least one of the first and second electrodes may be formed of a nonprecious-metal.

At least one of the first and second electrodes may include at least one of Ru, Ni, W, Al, TiN, and a combination thereof.

At least one of the first and second electrodes may include at least one of Pt, Ir, Pd, Au, Ru, Ti, Ta, TiN, TiW, TaN, W, Ni, Al, a conductive oxide, and an alloy thereof.

The resistance change characteristic of the memory layer may result from the movement of ionic species between the oxygen-supplying layer and the oxide layer.

The ionic species may be oxygen ions.

A memory device according to example embodiments may include the above-described non-volatile memory element.

The memory device may further include a switching element connected to the non-volatile memory element.

A cross-point memory device according to example embodiments may include a plurality of first wirings arranged parallel to each other; a plurality of second wirings arranged parallel to each other and across the plurality of first wirings to form a plurality of cross-points; and a plurality of first memory cells, each of the plurality of memory cells disposed at a corresponding cross-point between one of the first wirings and one of the second wirings, wherein each of the plurality of the first memory cells includes a first memory layer, wherein the first memory layer includes an oxygen-supplying layer and an oxide layer, wherein the oxide layer has a multi-trap level (a plurality of trap levels), and wherein the first memory layer has a resistance change characteristic.

The oxygen-supplying layer may include at least one of Ta oxide, Zr oxide, yttria-stabilized zirconia (YSZ), Ti oxide, Hf oxide, Mn oxide, Mg oxide, and a combination thereof.

The oxygen-supplying layer may include $TaO_x$, wherein $x<2.5$.

The oxide layer may include an oxide having a plurality of oxidation states.

The oxide may include at least one of Zr oxide, Mn oxide, Fe oxide, Mo oxide, W oxide, Ln oxide, and a combination thereof.

The oxide may be a Zr oxide.

The oxygen-supplying layer may include Ta oxide.

The oxide layer may be doped with at least one of Y, Sc, Ca, and La.

The oxide layer may have a thickness in the range of about 5 to about 30 nm.

The oxide layer may be a material layer, and an oxygen concentration in the material layer may be changed gradually or regionally in a thickness direction.

The oxygen concentration of the oxide layer may increase toward the second wiring.

The first memory cell may further include a first switching element connected to the first memory layer.

The first memory cell may further include a first intermediate electrode disposed between the first memory layer and the first switching element.

The cross-point memory device may further include a reaction-inhibiting layer disposed between the first wiring and the first memory layer.

The resistance change characteristic of the first memory layer may result from the movement of ionic species between the oxygen-supplying layer and the oxide layer.

The ionic species may be oxygen ions.

The cross-point memory device may further include a plurality of second memory cells and a plurality of third wirings disposed above the second wirings, wherein the plurality of third wirings may be arranged so as to cross the second wirings and to form a plurality of cross-points with the second wirings, wherein each of the second memory cells may be disposed at a corresponding cross-point between one of the second wirings and one of the third wirings.

Each of the second memory cells may include a second memory layer having a resistance change characteristic resulting from the movement of ionic species between two material layers.

The second memory layer may have an inverted structure of the first memory layer or a structure that is the same as the first memory layer.

The second memory cell may further include a second switching element connected to the second memory layer.

The second memory cell may further include a second intermediate electrode disposed between the second memory layer and the second switching element.

The second memory cell may have an inverted structure of the first memory cell or a structure that is the same as the first memory cell.

BRIEF DESCRIPTION OF THE DRAWINGS

The foregoing and/or other aspects, objects, features, and advantage of the invention will become more apparent and readily appreciated when the following description of the non-limiting embodiments is taken in conjunction with the accompanying drawings of which.

DETAILED DESCRIPTION

Figure 1:
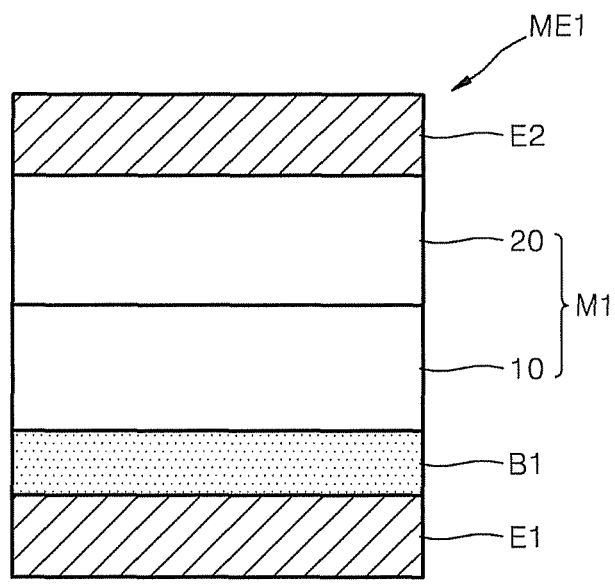
FIG. 1 is a cross-sectional view illustrating a non-volatile memory element according to example embodiments of the present invention.

Example embodiments will now be described more fully with reference to the accompanying drawings in which various non-limiting embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element (s) or feature (s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In the drawings, the thicknesses of layers and regions may have been exaggerated for clarity. Like reference numerals in the drawings denote like elements throughout the description of the figures.

FIG. 1 is a cross-sectional view illustrating a non-volatile memory element ME1 according to example embodiments of the present invention.

Referring to FIG. 1, the non-volatile memory element (hereinafter, referred to as a memory element) ME1 may include first and second electrodes E1 and E2 and a memory layer M1. The memory layer M1 may include a multi-layered structure disposed between the first and second electrodes E1 and E2. For example, the memory layer M1 may be formed with a double-layered structure including a first material layer 10 and a second material layer 20. The memory layer M1 may have a resistance change characteristic due to movement of ionic species between the first material layer 10 and the second material layer 20. The first material layer 10 may be formed of a first metal oxide, and the second material layer 20 may be formed of a second metal oxide. In the second material layer 20, an oxygen concentration may be changed gradually or regionally in a thickness direction in which the second material layer 20 is growing by a deposition process. A reaction-inhibiting layer B1 may be further included between the memory layer M1 and the first electrode E1. In other words, the reaction-inhibiting layer B1 may be placed between the first material layer 10 and the first electrode E1. Hereinafter, the memory element ME1 according to example embodiments will be described in more detail.

The first material layer 10 of the memory layer M1 may be formed of the first metal oxide. The first material layer 10 functions as an oxygen-supplying layer with respect to the second material layer 20. For example, the first material layer 10 may be formed of one of Ta oxide, Zr oxide, yttria-stabilized zirconia (YSZ), Ti oxide, Hf oxide, Mn oxide, Mg oxide, and a combination thereof. As an example, the first material layer 10 may include $TaO_x$, wherein 'x' may be less than about 2.5. Oxygen ions and/or oxygen vacancies may exist in the first material layer 10. A thickness of the first material layer 10 may be in the range of about several nanometers (nm) to about several hundred nanometers. As an example, the thickness of the first material layer 10 may be several tens of nm.

The second material layer 20 may exchange oxygen ions and/or oxygen vacancies with the first material layer 10 and induce a resistance change of the memory layer M1. In this regard, the second material layer 20 may be referred to as an oxygen exchange layer. The second material layer 20 may be an oxide layer having a multi-trap level (i.e., a plurality of trap levels). The trap and de-trap phenomenon of electrons are generally considered as one of the factors affecting a resistance value of the second material layer 20 at a high-resistance state. Factors affecting the high-resistance state of the second material layer 20 may include a thickness of the second material layer 20, positions of the traps, as well as, a trap level of the oxide. When the oxide has a plurality of trap levels, as a multi-trap level, a shallow trap and a deep trap may be formed by the oxygen vacancies existing inside the oxide and by interstitial oxygen, and thus the resistance of the second material layer 20 at the high-resistance state may be increased. For example, as the number of deep traps is increased compared to that of shallow traps, the resistance value of the second material layer 20 at the high-resistance state may be increased. The oxide having the multi-trap level can be an oxide including a plurality of oxidation states. For example, the oxide with the multi-trap level may include one of Zr oxide, Mn oxide, Fe oxide, Mo oxide, Nb oxide, W oxide, Ln oxide, and a combination thereof which have a plurality of oxidation states. A thickness of the second material layer 20, which is formed of the oxide with a multi-trap level, may be in a range of about 5 to about 30 nm.

Figure 2A:
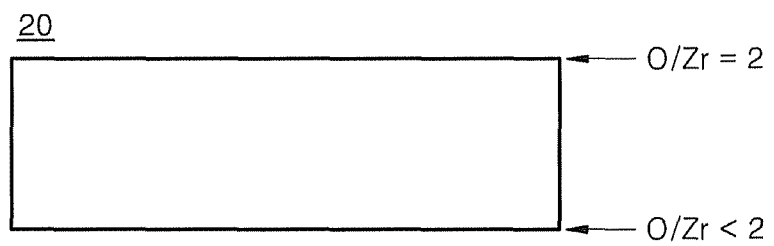
FIGS. 2A and 2B are cross-sectional views of different configurations of a second material layer in the non-volatile memory element of FIG. 1.

According to example embodiments, an oxygen concentration in the second material layer 20 may be changed gradually or regionally in a thickness direction in which the second material layer 20 is growing by a deposition process. As an example, when the oxygen concentration in the second material layer 20 is changed gradually, the oxygen concentration in the second material layer 20 may increase toward the second electrode E2. For example, when the second material layer 20 is a Zr oxide layer, a ratio between O and Zr at a portion of the second material layer 20 interfacing with the first material layer 10 may be in the range of from about 1 to about 1.5, and the ratio between O and Zr at a portion of the second material layer 20 interfacing with the second electrode E2 may be about 2. This is the case illustrated in FIG. 2A.

Figure 2B:
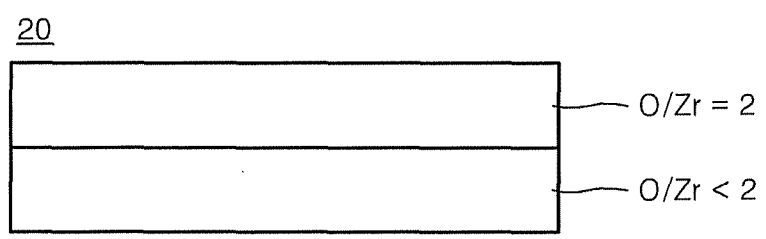

According to example embodiments, an oxygen concentration in the second material layer 20 may be changed regionally as illustrated in FIG. 2B. When the oxygen concentration in the second material layer 20 is changed regionally, the second material layer 20 may include a first region (a lower portion) interfacing with the first material layer 10 and a second region (an upper portion) interfacing with the second electrode E2. Between the first and second regions, an oxygen concentration of the second region may be greater than that of the first region. For example, a ratio between O and Zr in the first region adjacent to the first material layer 10 may be in a range of from about 1 to about 1.5, and the ratio between O and Zr in the second region adjacent to the second electrode E2 may be about 2. This is the case illustrated in FIG. 2B. In this case, a portion adjacent to the second electrode E2 of the second material layer 20 may have a stoichiometric composition or a composition close to the stoichiometric composition. On the other hand, a portion adjacent to the first material layer 10 of the second material layer 20 may have a non-stoichiometric composition. The portion adjacent to the first material layer 10 of the second material layer 20 may have a more significant affect on the resistance change of the memory layer M1 compared to the portion adjacent to the second electrode E2 of the second material layer 20.

A resistance change characteristic of the memory element ME1 may be improved with the oxygen concentration variation in the second material layer 20 in the thickness direction in which the second material layer 20 is growing by a deposition process. For example, the upper portion of the second material layer 20, which is interfacing with the second electrode E2 and having a stoichiometric composition or a composition close to the stoichiometric composition, may increase a ratio between ON resistance and OFF resistance of the memory element ME1. The ON/OFF resistance ratio can be increased, because the upper portion of the second material layer 20 has a relatively high resistance compared to remaining regions and also separates the second electrode E2 from the lower portion of the second material layer 20 which is contributing to the resistance-change characteristic with exchange of ionic species. Accordingly, an OFF current level may be decreased, and thus the ON/OFF resistance ratio may be increased.

The oxygen concentration variation in the second material layer 20 may further improve reliability, reproducibility, uniformity, as well, as stability of the memory element ME1. The upper portion of the second material layer 20, which interfaces with the second electrode E2 and has a stoichiometric composition or a composition close to the stoichiometric composition, may prevent or inhibit the remaining regions of the second material layer 20 from physically/chemically reacting with the second electrode E2 where the remaining regions substantially contribute to the resistance change characteristic. During a set (or reset) operation for exchanging ionic species between the first material layer 10 and the second material layer 20, oxygen ions and/or oxygen vacancies of the second material layer 20 may move to the second electrode E2 and then physically/chemically react with the second electrode E2, or the second material layer 20 itself may physically/chemically react with the second electrode E2. Therefore, there may be deterioration of reliability, reproducibility, uniformity, and/or stability of the resistance-change characteristic of the memory element ME1.

However, if the oxygen concentration in the second material layer 20 is changed, as described above, in the thickness direction of the second material layer 20, a region having a relatively high oxygen concentration with a stoichiometric composition (or a composition close to a stoichiometric composition) is formed in the portion interfacing with the second electrode E2 of the second material layer 20. The region having a relatively high oxygen concentration functions as a buffer so as to prevent or inhibit the remaining regions, which is substantially contributing to the resistance-change characteristic, from physically/chemically reacting with the second electrode E2. Since the region having a relatively high oxygen concentration of the second material layer 20 has a stoichiometric composition or a composition close to the stoichiometric composition, the region may be more stable than the remaining regions based on interatomic bonding energy. Accordingly, the region having a relatively high oxygen concentration in the second material layer 20 may increase a potential barrier between the remaining regions of the second material layer 20 and the second electrode E2. In other words, excessive current flow or movement of ionic species between the lower portion of the second material layer 20 and the second electrode E2 may be inhibited. The region having a relatively high oxygen concentration in the second material layer 20 may have a proper composition and thickness so as to function as a buffer while still allowing current flow. For example, a thickness of the region having a relatively high oxygen concentration in the second material layer 20 may be less than about 20 nm. Also, the remaining regions of the second material layer 20, that is, the region substantially contributing to the resistance-change characteristic, may have a thickness of less than about 10 nm. The entire thickness of the second material layer 20 may be in the range of about 5 to about 30 nm.

According to example embodiments, the second material layer 20 may be formed of a Zr oxide layer doped with a metal element such as Y, Sc, Ca, or La. The doping with the metal element may control an amount of the oxygen ions or oxygen vacancies in the second material layer 20 and may change charge mobility in the second material layer 20 as well. A doping concentration of the metal element may be or may not be uniform with regard to the second material layer 20 as a whole.

According to example embodiments, the reaction-inhibiting layer B1 may be formed between the first electrode E1 and the first material layer 10. The reaction-inhibiting layer B1 inhibits physical/chemical reactions between the first electrode E1 and the first material layer 10, and thus may improve reliability, reproducibility, uniformity, and/or stability of the resistance-change characteristic of the memory layer M1. The reaction-inhibiting layer B1 may include a material having an interatomic bonding energy greater than that of the first material layer 10. For example, when, the first material layer 10 is formed of Ta oxide, the interatomic bonding energy in the reaction-inhibiting layer B1 may be greater than an interatomic bonding energy of Ta—O bonding. In other words, the reaction-inhibiting layer B1 may be formed of a material more stable than the material of the memory layer M1 in terms of the interatomic bonding energy. The reaction-inhibiting layer B1 may further include a material which may increase a potential barrier between the first electrode E1 and the first material layer 10. In other words, the conduction band offset between the reaction-inhibiting layer B1 and the first electrode E1 may be greater than the conduction band offset between the first material layer 10 and the first electrode E1. This means that the reaction-inhibiting layer B1 may be formed of a material inhibiting an excessive current flow between the first electrode E1 and the first material layer 10. Similarly, the reaction-inhibiting layer B1 may include a material having a resistivity greater than that of the first material layer 10.

According to example embodiments, the reaction-inhibiting layer B1 may include at least one of $AlO_x$, $SiO_x$, $SiN_x$, $ZrO_x$, $HfO_x$, and a combination thereof. The reaction-inhibiting layer B1 may or may not have a stoichiometric composition. The reaction-inhibiting layer B1 may have a proper composition and thickness to allow current flow while functioning as a buffer. As an example, a thickness of the reaction-inhibiting layer B1 may be less than about 10 nm. When the reaction-inhibiting layer B1 has a stoichiometric composition, the thickness of the reaction-inhibiting layer B1 may be less than about 5 nm. If the reaction-inhibiting layer B1 is too thick, then an insulating property of the reaction-inhibiting layer B1 may be increased. Therefore, a proper thickness of the reaction-inhibiting layer B1 may be less than about 10 nm as described above.

According to example embodiments, the first and second electrodes E1 and E2 may be formed of a non-precious metal (e.g., Ti, Ta, TiN, TiW, TaN, W, Ni, and Al), a relatively inexpensive precious metal (e.g., Ru), or an alloy thereof. In addition, the first and second electrodes E1 and E2 may also be formed of a conductive oxide. The conductive oxide may be a ZnO-based oxide (e.g., indium zinc oxide, IZO) or a SnO-based oxide (e.g., indium tin oxide, ITO). According to example embodiments, a stable memory characteristic may be obtained without employing first and second electrodes E1 and E2 formed from a relatively expensive precious metal, because the reaction-inhibiting layer B1 is used and the oxygen concentration in the second material layer 20 is changed in the thickness direction. On the other hand, if there is no oxygen concentration variation in the second material layer 20 in the thickness direction and the reaction-inhibiting layer B1 is not formed, then the first and second electrodes E1 and E2 should be formed of a precious metal having a relatively low reactivity (which may be relatively expensive) in order to obtain a desired level of a memory characteristic. Thus, the use of a precious metal for the electrodes may increase the manufacturing cost of a memory device. However, it may still be relatively difficult to obtain reproducibility/stability of a resistance change characteristic even though the first and second electrodes E1 and E2 are formed of a precious metal. According to example embodiments, the first and second electrodes E1 and E2 can be formed of a relatively low-priced material while obtaining reproducibility/stability of a memory characteristic with relative ease when there is an oxygen concentration variation in the second material layer 20 in the thickness direction and when the reaction-inhibiting layer B1 is used. It should be understood that a precious metal is not excluded as a material for forming the first and second electrodes E1 and E2 according to example embodiments. Rather, the first and second electrodes E1 and E2 may be formed of a precious metal (e.g., Pt, Ir, Pd, or Au), when it is necessary. Therefore, the first and second electrodes E1 and E2 may include one of Pt, Ir, Pd, Au, Ru, Ti, Ta, TiN, TiW, TaN, W, Ni, Al, a conductive oxide and a combination thereof. In addition, the first and second electrodes E1 and E2 may be formed of various electrode materials which are generally used in a semiconductor device.

Hereinafter, a resistance change mechanism of the memory element ME1 will be described in detail with reference to FIGS. 3A and 3B.

Figure 3A:
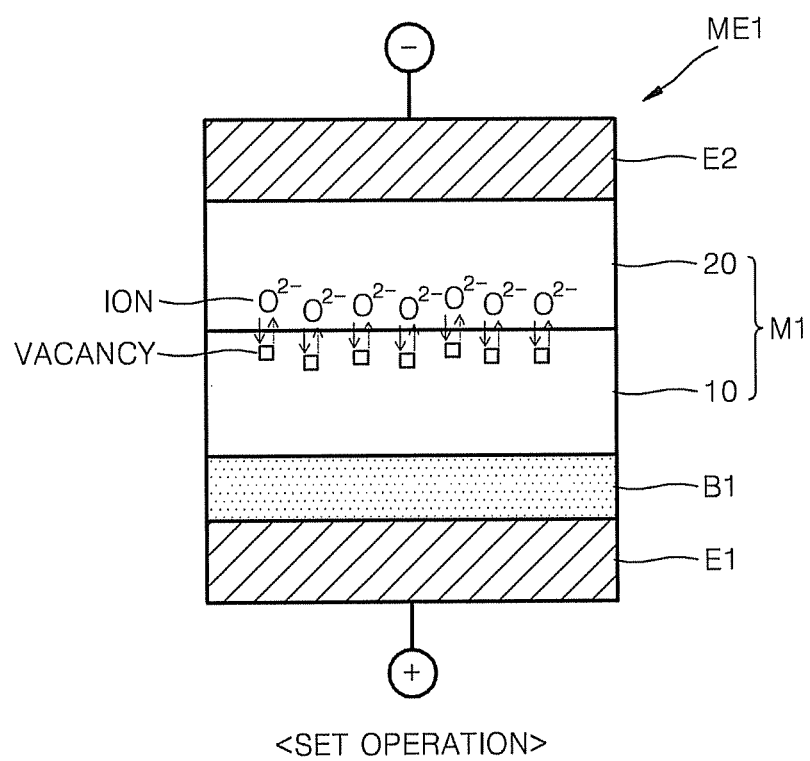
FIGS. 3A and 3B are cross-sectional views illustrating an operational mechanism in the non-volatile memory element of FIG. 1.

As illustrated in FIG. 3A, a positive voltage is applied to the first electrode E1 and a negative voltage is applied to the second electrode E2 during a set operation. As a result, oxygen vacancies may move from the first material layer 10 to the second material layer 20, and thus a current path (not shown) may be formed in the second material layer 20. Accordingly, a resistance of the memory layer M1 may be decreased, and the memory layer M1 may change from an OFF state to an ON state. In this set operation, oxygen ions may move in a direction opposite to the moving direction of the oxygen vacancies, that is, from the second material layer 20 to the first material layer 10.

Figure 3B:
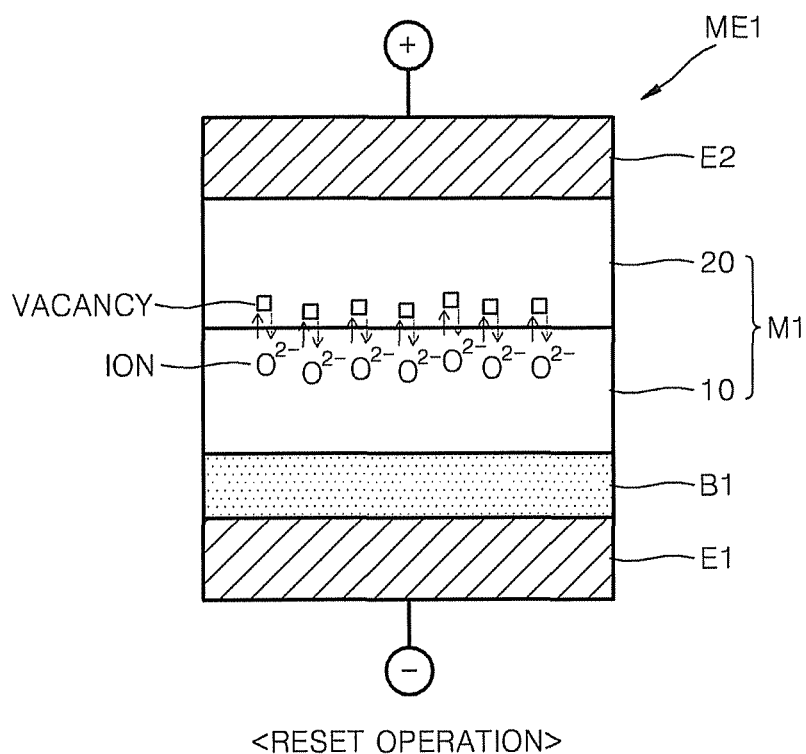

As illustrated in FIG. 3B, a negative voltage is applied to the first electrode E1 and a positive voltage is applied to the second electrode E2 during a reset operation. As a result, oxygen vacancies may move from the second material layer 20 to the first material layer 10, while oxygen ions may move from the first material layer 10 to the second material layer 20. Therefore, the current path (not shown) formed in the second material layer 20 may be broken. Accordingly, a resistance of the memory layer M1 may be increased, and thus the memory layer M1 may change from an ON state to an OFF state.

As described before, the upper portion/region of the second material layer 20, which has a higher oxygen concentration, and the reaction-inhibiting layer B1 may function to improve stability, reliability and reproducibility of a resistance change characteristic during the set/reset operations. Without the region having a higher oxygen concentration in the second material layer 20 and the reaction-inhibiting layer B1, oxygen ions and/or oxygen vacancies related to a resistance change may move toward the first and second electrodes E1 and E2 during the set/reset operations. The oxygen ions and/or oxygen vacancies may physically/chemically react with the first and second electrodes E1 and E2, or the memory layer M1 itself may physically/chemically react with the first and second electrodes E1 and E2. Therefore, stability, reliability, and reproducibility of the resistance change characteristic of the memory element ME1 may be deteriorated. For example, a breakdown phenomenon may occur, in which an amount of current flow between the first electrode E1 and the second electrode E2 may be rapidly increased. In addition, an undesired material layer may be formed at interfaces between the memory layer M1 and each of the first and second electrodes E1 and E2 by a reaction therebetween, which may further deteriorate the resistance change characteristic. Such problems may be more serious when the first and second electrodes E1 and E2 are formed of an inexpensive non-precious metal. Furthermore, continuous ON/OFF switching operations may increase the possibility of the above noted problems. For instance, when a $TaO_x$ layer is used as a resistance change material, a resistance change characteristic can be significantly changed according to the method of forming the $TaO_x$ layer, the deposition condition, and the oxygen content. Thus, it is relatively difficult to obtain reproducibility and stability of the resistance change characteristic based on material alone. However, the reproducibility and stability of the resistance changed characteristics can be obtained while preventing the problems described previously when the reaction-inhibiting layer B1 is formed between the first electrode E1 and the memory layer M1, and a higher oxygen concentration region is formed in the upper portion of the second material layer 20, as described in example embodiments herein.

When the higher oxygen concentration region is formed in the upper portion of the second material layer 20 along with the inclusion of the reaction-inhibiting layer B1, the first and second electrodes E1 and E2 may be formed of a precious metal, a non-precious metal, and/or a conductive oxide. Without the higher oxygen concentration region in the second material layer 20 and the inclusion of the reaction-inhibiting layer B1, it may be relatively difficult to form the first and second electrodes E1 and E2 with a conductive oxide or a non-precious metal having a relatively high reactivity. Additionally, the use of a precious metal for the first and second electrodes E1 and E2 may increase a manufacturing cost of the device and may put various restrictions on the manufacturing process. However, according to example embodiments, the first and second electrodes E1 and E2 may be formed with relative ease not only of a precious metal but also of a non-precious metal and/or a conductive oxide. Thus, the manufacturing cost may be reduced, and there may also be various advantages to the manufacturing process.

Figure 4:
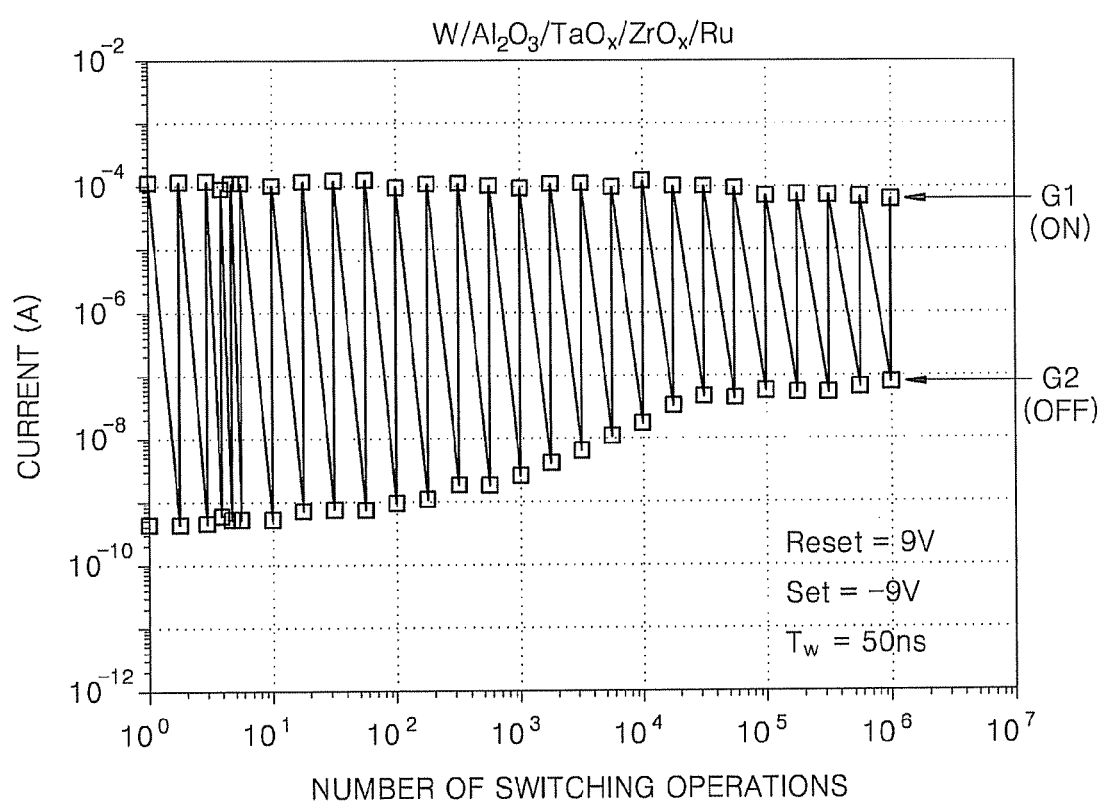
FIG. 4 is a graph showing variations of ON and OFF current with the number of switching operations according to a non-limiting example embodiment having a structure of $W/Al_2O_3/TaO_x/ZrO_x/Ru$.

FIG. 4 is a graph showing variations of ON and OFF currents with the number of switching operations according to example embodiments. FIG. 4 is obtained with the memory element having a structure of $W/Al_2O_3/TaO_x/ZrO_x/Ru$. The memory element has the structure illustrated in FIG. 1, and thus includes the first electrode E1, the reaction-inhibiting layer B1, the first material layer 10, the second material layer 20, and the second electrode E2, which are formed of W, $Al_2O_3$, $TaO_x$, ZrOx, and Ru, respectively. In the second material layer 20 formed of $ZrO_x$, an oxygen concentration is changed in a thickness direction in which the second material layer 20 is grown during a deposition process. In FIG. 4, a first graph G1 shows the variation of an ON current, and a second graph G2 shows the variation of the OFF current.

Referring to FIG. 4, the resistance change characteristic is relatively stable after repeating ON/OFF switching operations more than $10^6$ times. In particular, a difference between the ON current and the OFF current is as large as about 4 to 5 orders of magnitude (i.e., about $10^4$ to $10^5$).

Figure 5:
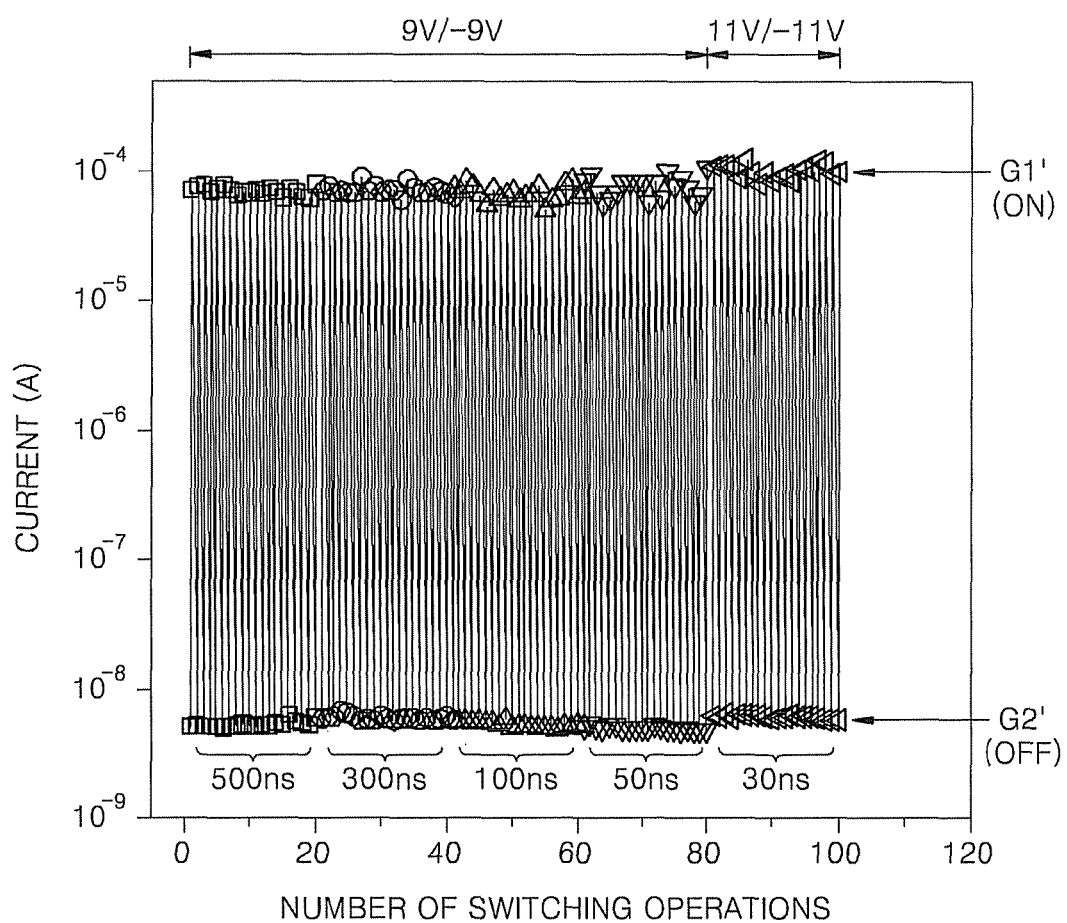
FIG. 5 is a graph showing variations of ON and OFF current with the number of switching operations at various switching conditions in a non-limiting example embodiment having a structure of $W/Al_2O_3/TaO_x/ZrO_x/Ru$ of FIG. 4.

FIG. 5 is a graph showing variations of the ON and OFF currents with the number of switching operations at various switching conditions in the non-limiting example embodiment having a structure of $W/Al_2O_3/TaO_x/ZrO_x/Ru$ of FIG. 4. Two different voltages (i.e. "9V/−9V" and "11V/−11V") are applied to the memory element during various applied times (i.e., pulse widths). When the applied voltage is "9V/−9V", each voltage pulse is applied with four different applied times (pulse widths), e.g., 500 ns, 300 ns, 100 ns, and 50 ns. When the applied voltage is "11V/−11V", each voltage pulse is applied during an applied time of 30 ns. In FIG. 5, a first graph G1' and a second graph G2' show the ON and OFF currents at the different conditions respectively.

Referring to FIG. 5, when the applied voltage is "9V/−9V", an ON/OFF switching characteristic of the memory element is favorable even if the applied time for each voltage pulse is reduced to 50 ns. In addition, when the condition of an applied voltage is "11V/−11V", the ON/OFF switching characteristic is still favorable even if the applied time for each voltage pulse is shorter (e.g., 30 ns). Therefore, the memory element according to example embodiments has a significantly higher operation speed, compared to a conventional memory device such as a flash memory. This also shows that the memory element has a relatively high operation speed and an advantageous ON/OFF switching characteristic if an oxygen concentration of a zirconium oxide layer ($ZrO_x$) is changed in the thickness direction of the second material layer 20 and if the reaction-inhibiting layer B1 formed of an $Al_2O_3$ layer is present.

The memory element according to example embodiments of the present invention may have an advantageous memory characteristic (e.g., a sufficient ON/OFF resistance ratio, a relatively high operation speed, etc.) and may have improved reliability, uniformity, and reproducibility. In addition, the manufacturing cost of the memory element may be reduced by using an inexpensive electrode material which may further provide advantages in the manufacturing process.

The memory element according to example embodiments of the present invention may be used in memory devices having various structures. The memory device may further include a switching element connected to the memory element.

Figure 6:
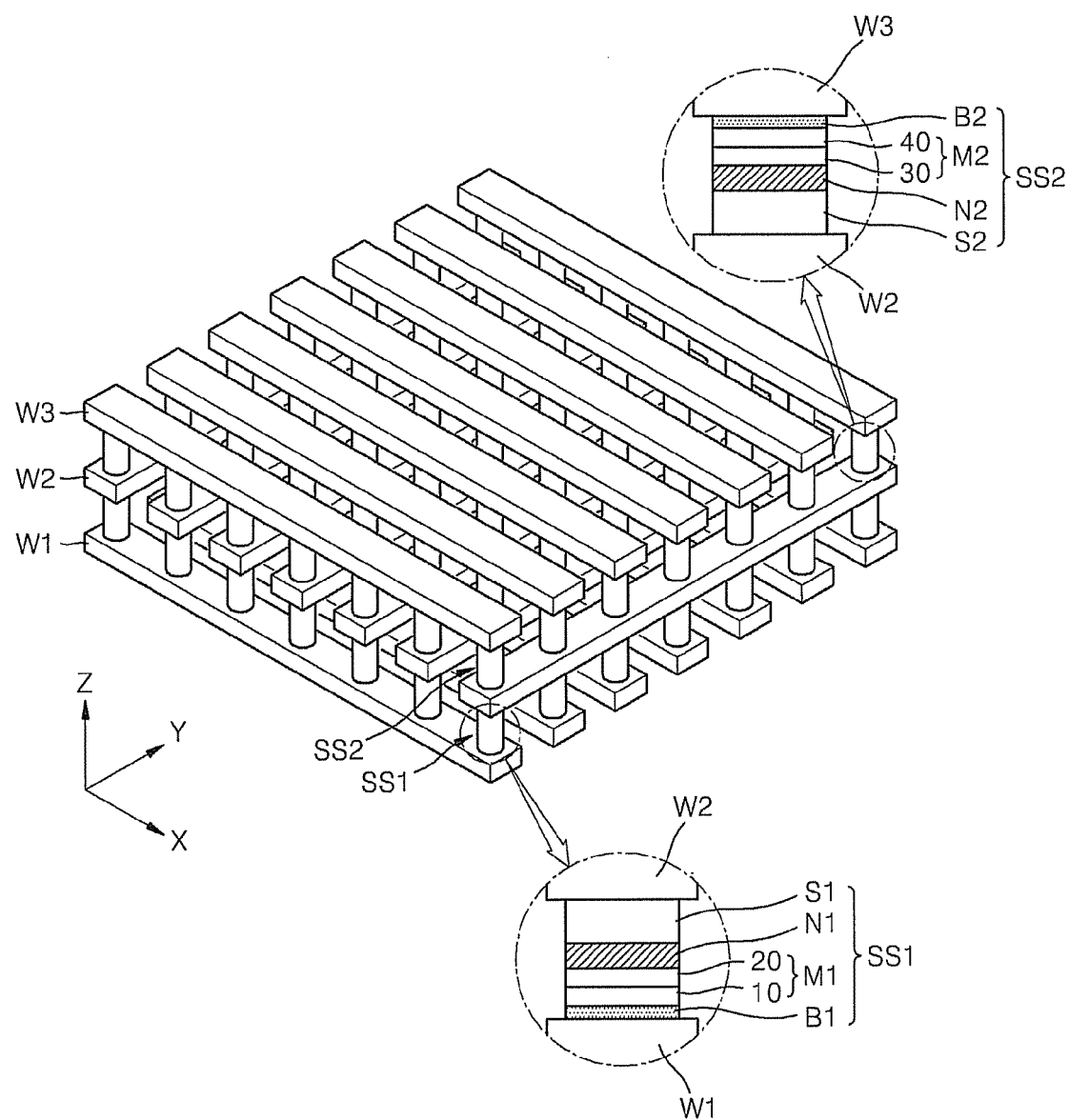
FIG. 6 is a perspective view illustrating a memory device including the non-volatile memory element of FIG. 1, according to example embodiments of the present invention.

FIG. 6 is a perspective view illustrating a memory device including the memory element of FIG. 1, according to example embodiments of the present invention. The memory device may be a cross-point resistive memory device.

Referring to FIG. 6, a plurality of first wirings W1 may be formed parallel to one another in a first direction, e.g., in an X-direction. A plurality of second wirings W2 may be formed in a direction crossing the first wirings W1, e.g., in a Y-direction. Each of a plurality of first stack structures (first memory cell) SS1 may be formed in each cross-point between the first wirings W1 and the second wirings W2. The first stack structure SS1 may include a first reaction-inhibiting layer B1, a first memory layer M1, a first intermediate electrode Ni, and a first switching element S1, that are sequentially stacked on the first wiring W1. The first memory layer M1 may include a first material layer 10 and a second material layer 20. Alternatively, in the first stack structure SS1, it should be understood that the positions of the first memory layer M1 and the first switching element S1 may be switched. In such a case, the position of the first reaction-inhibiting layer B1 may be changed to the side of the second wiring W2. The first reaction-inhibiting layer B1, the first material layer 10, and the second material layer 20 may correspond to the reaction-inhibiting layer B1, the first material layer 10, and the second material layer 20 of FIG. 1, respectively. The first switching element S1 may be formed of a bi-directional diode, a threshold switching device, a varistor, or other suitable structure. For instance, when the first switching element S1 is a bi-directional diode, the bi-directional diode may be an oxide diode. If a silicon diode is used, the silicon diode needs to be formed by a relatively high temperature process at a temperature of about 800° C. This relatively high temperature process may cause a restriction in selecting a substrate material and many other problems which may occur due to the relatively high temperature. Accordingly, when the first switching element S1 is formed of an oxide layer which may be formed with relative ease at room temperature, various advantages may be obtained. As addressed above, the use of silicon may present some difficulties in the process, but it should be understood that a silicon material is not excluded as a material for forming the first switching element S1. Rather, the first switching element S1 may be formed of silicon or other qualified materials when it is desired. The first wiring W1 and first intermediate electrode N1 may correspond to the first electrode E1 and the second electrode E2 of FIG. 1, respectively. Accordingly, at least one of the first wiring W1 and the first intermediate electrode N1 may include at least one of Pt, Ir, Pd, Au, Ru, Ti, Ta, TiN, TiW, TaN, W, Ni, Al, a conductive oxide, and an alloy thereof. The second wiring W2 may be or may not be formed from the material which is used for the first wiring W1.

A plurality of third wirings W3 may be further formed above upper surfaces of the second wirings W2. The plurality of third wings W3 are positioned parallel each other and spaced at a predetermined interval. The third wirings W3 may cross the second wirings W2 and may be arranged at the same interval with the first wirings W1. Each of a plurality of second stack structures (second memory cell) SS2 may be formed in each cross-point between the second wirings W2 and the third wirings W3. The second stack structure SS2 may include a second switching element S2, a second intermediate electrode N2, a second memory layer M2, and a second reaction-inhibiting layer B2 sequentially stacked on the second wiring W2. The second memory layer M2 may include a third material layer 30 and a fourth material layer 40. Alternatively, in the second stack structure SS2, it should be understood that the positions of the second memory layer M2 and the second switching element S2 may be switched. In such a case, the position of the second reaction-inhibiting layer B2 may be changed to the side of the second wiring W2. The second memory layer M2 may have a reversed structure relative to the first memory layer M1, meaning that the structure of the second memory layer M2 may be an mirror image of that of the first memory layer M1 along the second wiring W2. In other words, the third material layer 30 and the fourth material layer 40 of the second memory layer M2 may have an inversed structure relative to the second material layer 20 and the first material layer 10, respectively. Alternatively, the second memory layer M2 may have a stack structure that is the same as that of the first memory layer M1. That is, the third material layer 30 and the fourth material layer 40 of the second memory layer M2 may correspond to the first material layer 10 and the second material layer 20 of the first memory layer M1, respectively. The second reaction-inhibiting layer B2 may be formed of a material which is used for the first reaction-inhibiting layer B1. The second reaction-inhibiting layer B2 may be disposed between the second intermediate electrode N2 and the second memory layer M2 instead of between the second memory layer M2 and the third wiring W3. The second switching element S2 may have an inversed structure of the first switching element S1 or a stack structure that is the same as the first switching element S1. In other words, a switching direction of the second switching element S2 may be opposite to or the same as that of the first switching element S1. The third wiring W3 and the second intermediate electrode N2 may correspond to the first electrode E1 and the second electrode E2 of FIG. 1, respectively, or may correspond to the second electrode E2 and the first electrode E1 of FIG. 1, respectively. Accordingly, at least one of the third wiring W3 and the second intermediate electrode N2 may include at least one of Pt, Ir, Pd, Au, Ru, Ti, Ta, TiN, TiW, TaN, W, Ni, Al, a conductive oxide, and an alloy thereof.

In FIG. 6, the first and second stack structures SS1 and SS2 are illustrated as having a cylindrical column shape, but it should be understood that they may have other various shapes. For example, the first and second stack structures SS1 and SS2 may have a square pillar shape or a pillar shape in which a width of the column increases in a downward direction. The first and second stack structures SS1 and SS2 may also have an asymmetrical shape. As an example, the first and/or second stack structures SS1 and SS2 may have a section with a cross-sectional area larger than an area of the cross-point formed by the neighboring wirings (e.g., W1 and W2, or W2 and W3). It is also possible that the first and/or second stack structures SS1 and SS2 may have a portion whose center is off from the center of the cross-point formed by the neighboring wirings. The shape of the memory device illustrated in FIG. 6 may be further varied in accordance with the spirit and scope of the present invention.

According to example embodiments, the memory device of FIG. 6 may further include an additional stack structure (not shown) on the third wiring W3. The additional stack structure may include a third stack structure and a fourth wiring which may be the same as the first stack structure SS1 and the second wiring W2, respectively. In addition, the memory device may further include yet another stack structure (not shown) on the additional stack structure. Such a stack structure may include a fourth stack structure and a fifth wiring which may be the same as the second stack structure SS2 and the third wiring W3, respectively. Thus, it is possible to have more stack structures arranged (e.g., alternatively) on the third wiring W3 up to a desired level (e.g., at least four additional stack structures).

While the present invention has been particularly shown and described with reference to example embodiments using specific terms, the embodiments and terms that have been used for explanation should not be construed as limiting the scope of the present invention. For example, at least one additional material layer may be included in the memory element of FIG. 1. The memory element of FIG. 1 may be used not only in the cross-point memory device of FIG. 6 but also in other various memory devices. Therefore, while the scope of the invention is defined by the appended claims, it should not be unduly limited by the detailed description thereof, and all modifications and variations that would have been appreciated by those skilled in the art are intended to be included within the scope of the following claims.

What is claimed is:

1. A non-volatile memory element comprising:
a first electrode;
a second electrode; and
a memory layer between the first and second electrodes,
wherein the memory layer includes an oxygen-supplying layer and an oxide layer, the oxide layer has a plurality of trap levels, and the memory layer has a resistance change characteristic.

2. The non-volatile memory element of claim 1, wherein the oxygen-supplying layer includes at least one of Ta oxide, Zr oxide, yttria-stabilized zirconia (YSZ), Ti oxide, Hf oxide, Mn oxide, Mg oxide, and a combination thereof.

3. The non-volatile memory element of claim 1, wherein the oxygen-supplying layer includes $TaO_x$, with x<2.5.

4. The non-volatile memory element of claim 1, wherein the oxide layer includes an oxide having a plurality of oxidation states.

5. The non-volatile memory element of claim 1, wherein the oxide layer includes at least one of Zr oxide, Mn oxide, Fe oxide, Mo oxide, Nb oxide, W oxide, Ln oxide, and a combination thereof.

6. The non-volatile memory element of claim 1, wherein the oxide layer includes Zr oxide.

7. The non-volatile memory element of claim 6, wherein the oxygen-supplying layer includes Ta oxide.

8. The non-volatile memory element of claim 6, wherein the oxide layer is doped with at least one of Y, Sc, Ca, and La.

9. The non-volatile memory element of claim 1, wherein the oxide layer has a thickness ranging from about 5 to about 30 nm.

10. The non-volatile memory element of claim 1, wherein an oxygen concentration of the oxide layer changes gradually or regionally in a thickness direction of the oxide layer.

11. The non-volatile memory element of claim 10, wherein the oxygen concentration of the oxide layer increases with proximity to the second electrode.

12. The non-volatile memory element of claim 1, further comprising:
a reaction-inhibiting layer between the first electrode and the memory layer.

13. The non-volatile memory element of claim 12, wherein the reaction-inhibiting layer includes at least one of $AlO_x$, $SiO_x$, $SiN_x$, $ZrO_x$, $HfO_x$, and a combination thereof.

14. The non-volatile memory element of claim 1, wherein at least one of the first and second electrodes is formed of a non-precious metal.

15. The non-volatile memory element of claim 1, wherein at least one of the first and second electrodes includes at least one of Ru, Ni, W, Al, TiN, and a combination thereof.

16. The non-volatile memory element of claim 1, wherein at least one of the first and second electrodes includes at least one of Pt, Ir, Pd, Au, Ru, Ti, Ta, TiN, TiW, TaN, W, Ni, Al, a conductive oxide, and an alloy thereof.

17. The non-volatile memory element of claim 1, wherein the resistance change characteristic results from movement of ionic species between the oxygen-supplying layer and the oxide layer.

18. The non-volatile memory element of claim 17, wherein the ionic species are oxygen ions.

19. A memory device comprising the non-volatile memory element of claim 1.

20. The memory device of claim 19, further comprising:
a switching element connected to the non-volatile memory element.

21. A cross-point memory device comprising:
a plurality of first wirings arranged in parallel;
a plurality of second wirings arranged in parallel and across the plurality of first wirings to form a plurality of first cross-points therebetween; and
a plurality of first memory cells, each of the plurality of first memory cells disposed at a corresponding cross-point between one of the plurality of first wirings and one of the plurality of second wirings,
wherein each of the plurality of the first memory cells includes a first memory layer, the first memory layer includes a first oxygen-supplying layer and a first oxide layer, the first oxide layer includes a plurality of trap levels, and the first memory layer has a resistance change characteristic.

22. The cross-point memory device of claim 21, wherein the first oxygen-supplying layer includes at least one of Ta oxide, Zr oxide, yttria-stabilized zirconia (YSZ), Ti oxide, Hf oxide, Mn oxide, Mg oxide, and a combination thereof.

23. The cross-point memory device of claim 21, wherein the first oxygen-supplying layer includes $TaO_x$, with x<2.5.

24. The cross-point memory device of claim 21, wherein the first oxide layer includes an oxide having a plurality of oxidation states.

25. The cross-point memory device of claim 21, wherein the first oxide layer includes at least one of Zr oxide, Mn oxide, Fe oxide, Mo oxide, Nb oxide, W oxide, Ln oxide, and a combination thereof.

26. The cross-point memory device of claim 21, wherein the first oxide layer includes Zr oxide.

27. The cross-point memory device of claim 26, wherein the first oxygen-supplying layer includes Ta oxide.

28. The cross-point memory device of claim 26, wherein the first oxide layer is doped with at least one of Y, Sc, Ca, and La.

29. The cross-point memory device of claim 21, wherein the first oxide layer has a thickness ranging from about 5 to about 30 nm.

30. The cross-point memory device of claim 21, wherein an oxygen concentration of the first oxide layer changes gradually or regionally in a thickness direction of the first oxide layer.

31. The cross-point memory device of claim 30, wherein the oxygen concentration of the first oxide layer increases with proximity to a corresponding second wiring.

32. The cross-point memory device of claim 21, wherein each of the plurality of first memory cells further includes a first switching element connected to the first memory layer.

33. The cross-point memory device of claim 21, further comprising:
a reaction-inhibiting layer between a corresponding first wiring and the first memory layer.

34. The cross-point memory device of claim 21, wherein the resistance change characteristic results from movement of ionic species between the first oxygen-supplying layer and the first oxide layer.

35. The cross-point memory device of claim 34, wherein the ionic species are oxygen ions.

36. The cross-point memory device of claim 21, further comprising:
a plurality of second memory cells and a plurality of third wirings above the plurality of second wirings,
wherein the plurality of third wirings are arranged across the plurality of second wirings to form a plurality of second cross-points therebetween, and each of the plurality of second memory cells is disposed at a corresponding cross-point between one of the plurality of second wirings and one of the plurality of third wirings.

37. The cross-point memory device of claim 36, wherein each of the plurality of second memory cells includes a second memory layer having a second oxygen-supplying layer and a second oxide layer, the second memory layer having a resistance change characteristic resulting from movement of ionic species between the second oxygen-supplying layer and the second oxide layer.

38. The cross-point memory device of claim 37, wherein the second memory layer has an inverted structure relative to the first memory layer.

39. The cross-point memory device of claim 37, wherein the second memory layer has an identical structure to the first memory layer.

40. The cross-point memory device of claim 37, wherein each of the plurality of second memory cells further includes a second switching element connected to the second memory layer.

* * * * *